(12) United States Patent
Cheong et al.

(10) Patent No.: US 7,632,456 B2
(45) Date of Patent: Dec. 15, 2009

(54) PHASE CHANGE MATERIAL FOR HIGH DENSITY NON-VOLATILE MEMORY

(75) Inventors: Byung-ki Cheong, Seoul (KR); Jeung-hyun Jeong, Seoul (KR); Dae-Hwan Kang, Seoul (KR); Han Ju Jung, Seoul (KR); Taek Sung Lee, Seoul (KR); In Ho Kim, Seoul (KR); Won Mok Kim, Seoul (KR); Kyeong Seok Lee, Seoul (KR)

(73) Assignee: Korea Institute of Science and Technology (KR)

( * ) Notice: Subject to any disclaimer, the term of this patent is extended or adjusted under 35 U.S.C. 154(b) by 0 days.

(21) Appl. No.: 11/411,558

(22) Filed: Apr. 25, 2006

(65) Prior Publication Data

US 2007/0001160 A1    Jan. 4, 2007

(30) Foreign Application Priority Data

Jun. 29, 2005    (KR) ...................... 10-2005-0056892

(51) Int. Cl.
C22C 12/00    (2006.01)
B41M 5/26    (2006.01)
G11B 7/24    (2006.01)

(52) U.S. Cl. ...................... 420/576; 257/613; 428/64.1; 428/64.5; 369/59.11

(58) Field of Classification Search ................ 420/576; 257/613; 428/64.1, 64.5; 369/59.11
See application file for complete search history.

(56) References Cited

U.S. PATENT DOCUMENTS

2003/0072241 A1 *    4/2003    Ogawa ..................... 369/59.11

FOREIGN PATENT DOCUMENTS

JP    2002264515    *    9/2002

* cited by examiner

*Primary Examiner*—Sikyin Ip
(74) *Attorney, Agent, or Firm*—Baker & Hostetler, LLP

(57) ABSTRACT

The present invention provides a phase change non-volatile memory material comprising a base material and at least one non-metallic light element selected from the group consisting of boron, carbon, nitrogen and oxygen, wherein the base material has a composition which corresponds to either that of congruent melting of the type with a minimum melting point or that of eutectic melting within the range of ±0.15 atomic fraction for each constituent element, thereby having a melting temperature of 600° C. or lower. The phase change non-volatile memory material according to the present invention may be utilized to reduce the electric power needed for reset/set operation and thermal interference between memory cells.

1 Claim, 6 Drawing Sheets

PHASE CHANGE MATERIAL FOR HIGH DENSITY NON-VOLATILE MEMORY

FIELD OF THE INVENTION

The present invention relates to a phase change material for a high density non-volatile memory.

BACKGROUND OF THE INVENTION

With the recent advancement in the field of high density information storage device, it has become a matter of special interest to develop an optical or electronic memory device through the implementation of a chalcogenide-based phase change material. By exploiting fast and reversible phase changes between the crystalline and amorphous states and their differences in optical characteristics or in electrical resistance, a means of information storage can be attained. For instance, the difference in their optical reflectance is utilized in rewritable CD and DVD optical disks, while phase change non-volatile memory and electrical probe-based memory exploit the difference in the electrical resistance between crystalline and amorphous states.

Specifically, phase change non-volatile memory devices named alternatively OUM (Ovonic Unified Memory), PRAM (Phase-change Random Access Memory), or CRAM (Chalcogenide Random Access Memory) have been actively researched for commercialization as viable substitutes for flash memory with DRAM-level performance.

In FIGS. 1a and 1b, two kinds of phase change non-volatile memory devices are presented.

Basically, they both have top electrodes 11, 11' and bottom electrodes 12, 12' for the input and output of electrical signals; memory areas 13, 13' containing chalcogenide-based phase change materials; and insulating areas 14, 14' for electrical and thermal insulation.

The difference between these two structures is that the memory device of FIG. 1b is further provided with a separate electrode 15' for the joule-heating of the memory area 13'. On the other hand, the memory material itself is responsible for the joule-heating in FIG. 1a, the memory material being disposed in the central enclosed area 13.

The phase change memory device works by the following mechanism. When an electric voltage or current pulse is applied between the top and bottom electrodes, there takes place direct or indirect heating to melt the phase change material. At the end of the electric pulse, the melted phase change material is quenched to form an amorphous state, achieving information writing. This operation is called a reset operation. To erase this stored information, an electric pulse is applied to the amorphous phase change material such that suitable crystallization conditions in terms of, e.g. heating time and temperature, are met. Once crystallized, the stored information in the memory cell is erased. This operation is called a set operation.

The memory cell presents different electrical resistance depending on whether it is in a crystallized or amorphous state. The amorphous state exhibits a higher electrical resistance than the crystallized state. Therefore, by sensing the electrical resistance of a memory cell, stored binary information can be read.

Stoichiometric composition of a GeSbTe-based pseudo-binary material, $(GeTe)_x(Sb_2Te_3)_{1-x}$ (x represents a mole fraction, $0<x<1$) was developed as a practical phase change material capable of electrically switching between the amorphous and crystallized states in a reversible manner. Despite its merits as a phase change non-volatile memory material, the GeSbTe based material is disadvantageous in that it has a relatively high melting temperature of 600° C.~700° C. This is problematic since such a high melting temperature requires more current and power for a reset operation of a phase change memory cell.

Shown in FIG. 2 is the dependency of the current level supplied from a transistor and that needed for a reset operation on the minimum feature size (F) or contact size (0.5 F). The dashed line in FIG. 2 indicates the current level of a transistor supplied to a phase change memory cell having 8 $F^2$ DRAM cell structure as schematically shown in the inset. The solid line in FIG. 2 represents the change in the current level needed for a reset operation when the current density level is maintained at 100 mA/$\mu m^2$, which is the value slightly smaller than the current density value estimated from the reset current level and contact size of an existing phase change memory proto-type (refer to the results of Intel/Ovonyx in ISSCC 2002 and Samsung Electronics in NVSMW 2003, the current density being 123.5 mA/$\mu m^2$ and 138.9 mA/$\mu m^2$, respectively).

As shown in FIG. 2, the current level supplied from the transistor cannot match the required reset current level until the feature size is reduced down to about 45 nm or smaller.

Reduction of the current level needed for a reset operation may be achieved by; lowering the melting temperature of the phase change material used in the memory cell; enhancing the generation/confinement of joule heat by way of changing the materials and the structure of the memory cell; or combining both.

In fact, substantial improvement may not be gained just by lowering the melting temperature of the memory material; for example, the drastic reduction of the melting temperature from 900 K to 450 K would save only 50% of the electric power. Accordingly, a combined approach is in need.

Another technical issue of critical importance in the development of a successful phase change memory device, is to reduce the thermal interference between memory cells so as to prevent a possible crystallization of the memory material in the amorphous state by the heat produced in adjacent cells during the reset process. A fundamental approach to this problem would be to lower the melting temperature of the memory material while raising the crystallization temperature thereof.

In summary, in order to reduce the power consumption and thermal interference between cells, there exists a need to develop a memory material having a low melting temperature and a high crystallization temperature together with the optimal characteristics of joule heat generation and confinement.

SUMMARY OF THE INVENTION

It is, therefore, an object of the present invention to provide a phase change non-volatile memory material and a memory device using the same so as to reduce power consumption and thermal interference between memory cells.

In accordance with the present invention, there is provided a phase change non-volatile memory material comprising a base material and at least one non-metallic light element selected from the group consisting of boron, carbon, nitrogen and oxygen added to the base material, wherein the base material has a composition which, when expressed in terms of atomic fractions of constituent elements, corresponds to either that of congruent melting of the type with a minimum melting point or that of eutectic melting within the range of ±0.15 atomic fraction for each constituent element, thereby having a melting temperature of 600° C. or lower.

In accordance with an embodiment of the present invention, there is provided a phase change non-volatile memory material having the following composition:

$$A_xM_y(Sb_aTe_{1-a})_z$$

wherein, A is at least one element selected from the group consisting of boron, carbon, nitrogen and oxygen; M is at least one element selected from the group consisting of Ge, Ag, In and Ga; and x, y, z and a are mole fractions satisfying x+y+z=1, 0<x<0.2, 0≦y<0.4, and 0.6≦a≦1, respectively.

In accordance with a preferred embodiment of the present invention, the base material may be a Sb—Te binary solution/compound or a Sb—Te binary solution/compound substituted in part by at least one element selected from the group consisting of Ge, Ag, In and Ga.

In accordance with another preferred embodiment of the present invention, there is provided a phase change non-volatile memory material having the following composition:

$$A_xM_y(Sb_aTe_{1-a})_z$$

wherein, A is at least one element selected from the group consisting of boron, carbon, nitrogen and oxygen; M is at least one element selected from the group consisting of Ge, Ag, In and Ga; and x, y, z and a are mole fractions satisfying x+y+z=1, 0<x<0.2, 0<y<0.15, and 0.6<a<0.85, respectively.

In accordance with another preferred embodiment of the present invention, the base material may be a binary solution of Sb and an element selected from the group consisting of Ge, In and Ga, the composition of the binary solution corresponding to that of the eutectic melting within the range of ±0.1 atomic fraction for each constituent element.

In accordance with another preferred embodiment of the present invention, there is provided a phase change non-volatile memory material having the following composition:

$$A_zM_ySb_z$$

wherein, A is at least one element selected from the group consisting of boron, carbon, nitrogen and oxygen; M is at least one element selected from the group consisting of Ge, In and Ga; and x, y and z are mole fractions satisfying x+y+z=1, 0<x<0.2 and 0<y<0.4, respectively.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The preferred embodiment of the present invention will now be explained.

A phase change non-volatile memory material in accordance with the present invention comprises a base material and at least one non-metallic light element selected from the group consisting of boron (B), carbon (C), nitrogen (N) and oxygen (O), wherein the base material has a congruent or eutectic melting composition. A composition variation, in terms of the variation of the atomic fraction of each constituent element, of the order of ±0.15, preferably ±0.10, is acceptable. By adding non-metallic light elements to the base material in its vacancies, interstices or grain boundaries, the electrical and thermal conductivities can be lowered without significantly affecting the melting temperature of the base material (that is lower than those of conventional materials such as $Ge_2Sb_2Te_5$ and $Ge_1Sb_2Te_4$), which leads to a substantial power reduction for the reset operation. Additionally, the concomitant increase of crystallization temperature combined with a low melting temperature would reduce thermal interferences between memory cells, thereby enhancing data retention.

The base material constituting the phase change memory material in accordance with the present invention will be further explained below.

Figure 1A:
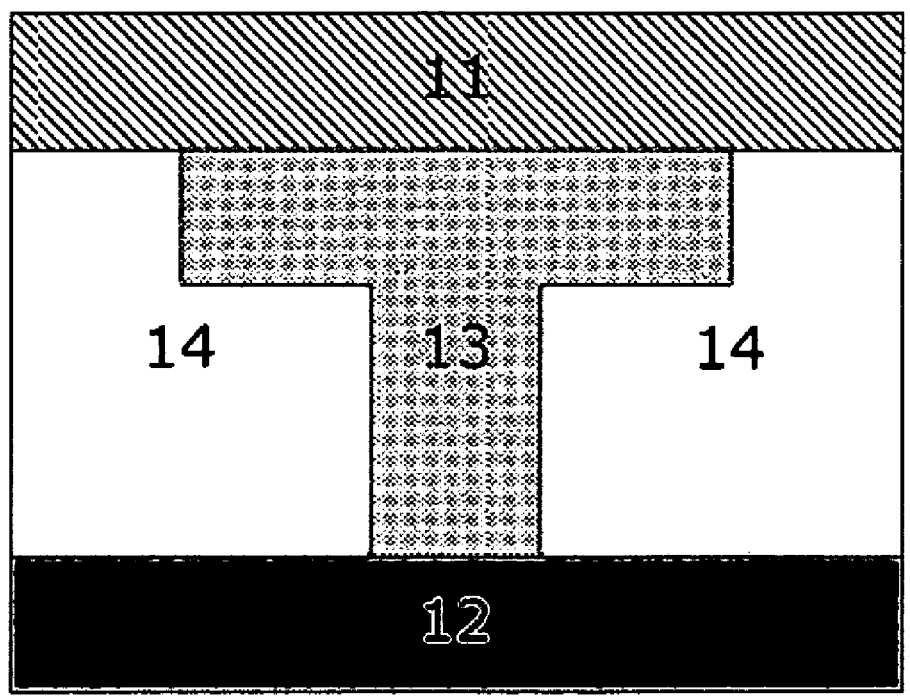
FIGS. 1a and 1b describe schematic diagrams of representative non-volatile phase change memory cells.
Figure 1B:
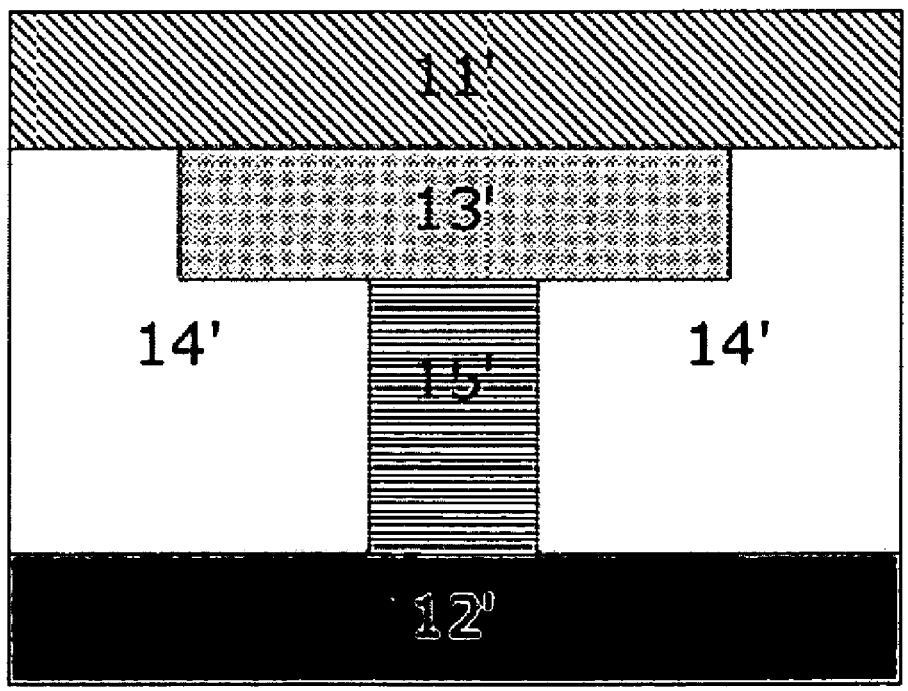
Figure 2:
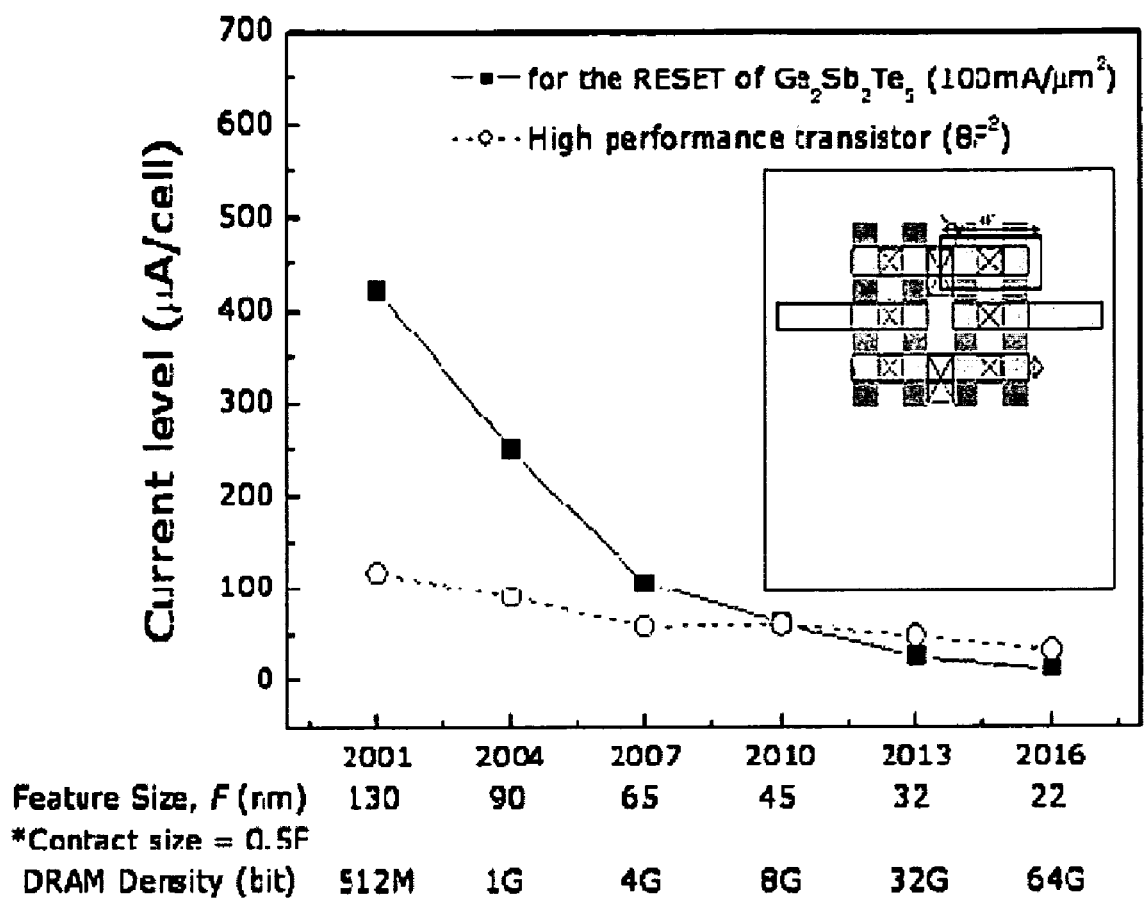
FIG. 2 shows changes in the current level supplied from a transistor and that needed for the reset operation in a memory cell as function of minimum feature size (F) or contact size (0.5 F)
Figure 3A:
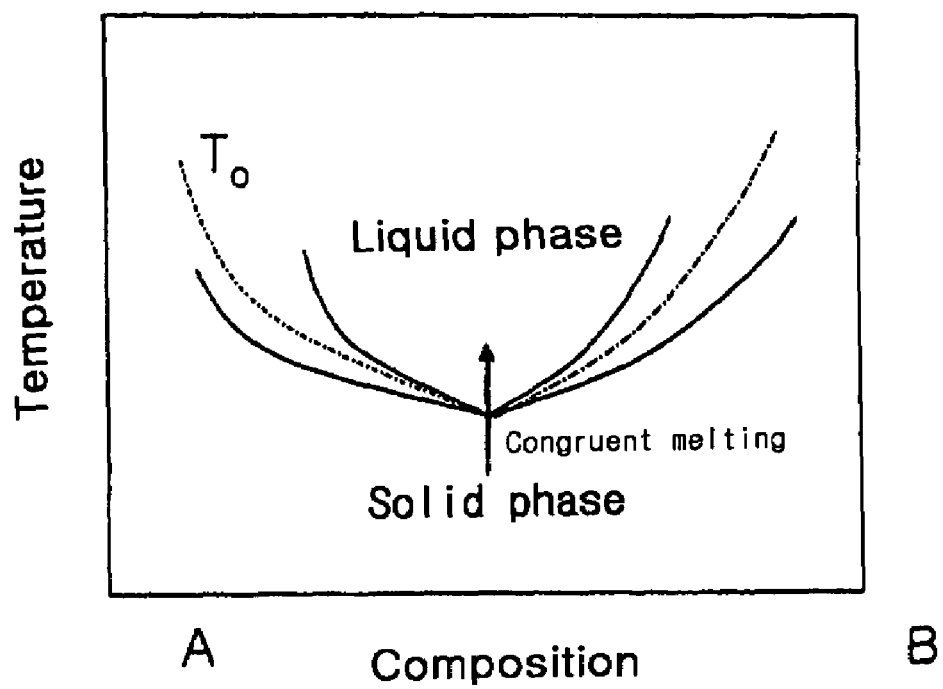
FIGS. 3a and 3b illustrate schematic phase diagrams showing congruent melting of the type with a minimum melting temperature and eutectic melting, respectively.
Figure 3B:
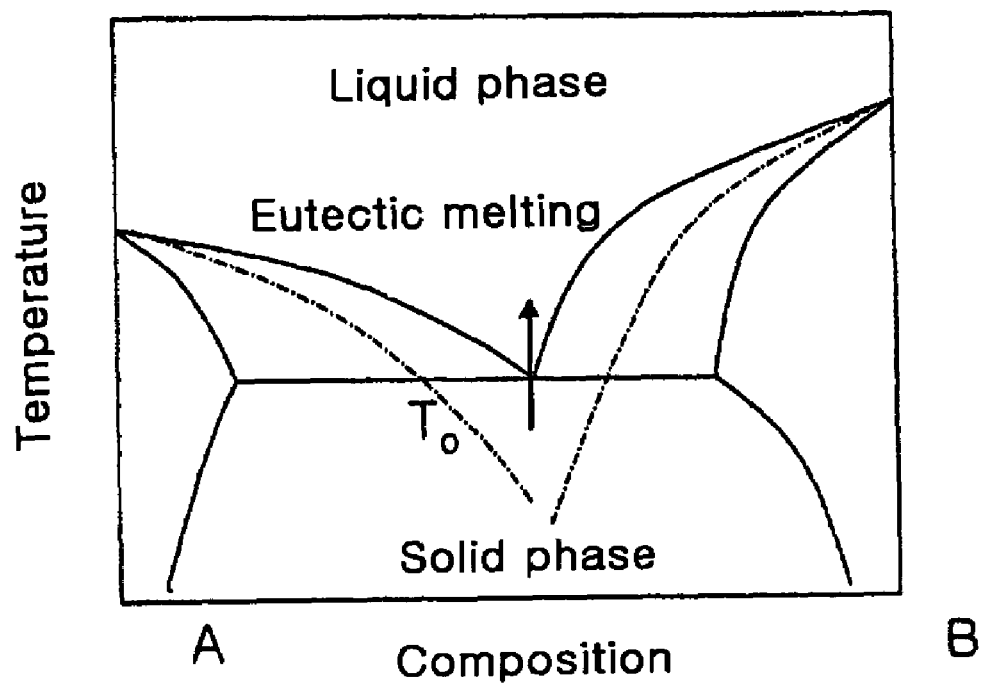

FIGS. 3a and 3b respectively illustrate schematic phase diagrams showing a congruent melting of the type with a minimum melting point and a eutectic melting point. Constituting materials (A and B) in FIGS. 3a and 3b, respectively, may be elements or solutions/compounds, and, therefore, the phase diagrams show the relationships between the composition and temperature for binary and pseudo-binary systems. According to FIG. 3a and 3b, it can be understood that the melting temperatures at the congruent or eutectic melting composition can be further lowered when the melting temperatures of A and B are lower. Free energies of the liquid and solid phases are balanced at the compositions and temperatures along the dashed lines ($T_o$) in the phase diagrams. For a material system featuring a congruent melting of the type with a minimum melting point or a eutectic melting, $T_o$ is low, indicating that the liquid phase is able to remain thermodynamically more stable than the solid phase down to a low temperature regime. Therefore, not only a low melting temperature but also a strong tendency for the formation of a quenched amorphous phase is readily accessible.

Examples of the base material of the inventive phase change material can be found among phase change materials for use in an optical disk.

First, an Sb—Te binary material or an Sb—Te based material having at least one substitutional element selected from the group consisting of Ge, Ag, In and Ga can be employed. The composition of $Sb_aTe_{1-a}$ (0<a<1) binary material preferably has 0.6≦a<0.85 so that it encompasses the congruent melting composition at 545° C. (a=0.727). The variation in the atomic fraction of the substitutional element is preferably ±0.15 or less so that it forms a stable or metastable single crystalline material.

Another example of the base material is a binary material comprising Sb and other elements such as Ge, In and Ga. The respective atomic fractions of the components are preferred to be within the range of ±0.1 around the eutectic melting composition in the phase diagrams of the respective binary systems (e.g., Sb-14.5 at % Ge, Sb-11.8 at % Ga, Sb-31.8 at % In).

By using such material with a low melting temperature as a base material and adding at least one non-metallic light element selected from the group consisting of boron (B), carbon (C), nitrogen (N) and oxygen (O) therein, the memory material in accordance with the present invention can be constructed to have a high crystallization temperature and excellent resistivity together with a low thermal conductivity. The roles of non-metallic light elements are illustrated below in reference to the case when a conventional material $Ge_2Sb_2Te_5$ is used as a base material.

$Ge_2Sb_2Te_5$ material undergoes phase change from an amorphous to a metastable rocksalt-like crystalline structure or a stable hexagonal crystalline structure depending on the crystallization conditions. During fast crystallization processes such as in the erasing operation of the phase change optical memory or set operation of the phase change electrical memory, a metastable rocksalt-like crystalline structure is obtained (N. Yamada, MRS Bulletin 21, 48, 1996; A. V. Kolobov et al., Nature Materials, 3, 703, 2004).

Figure 4A:
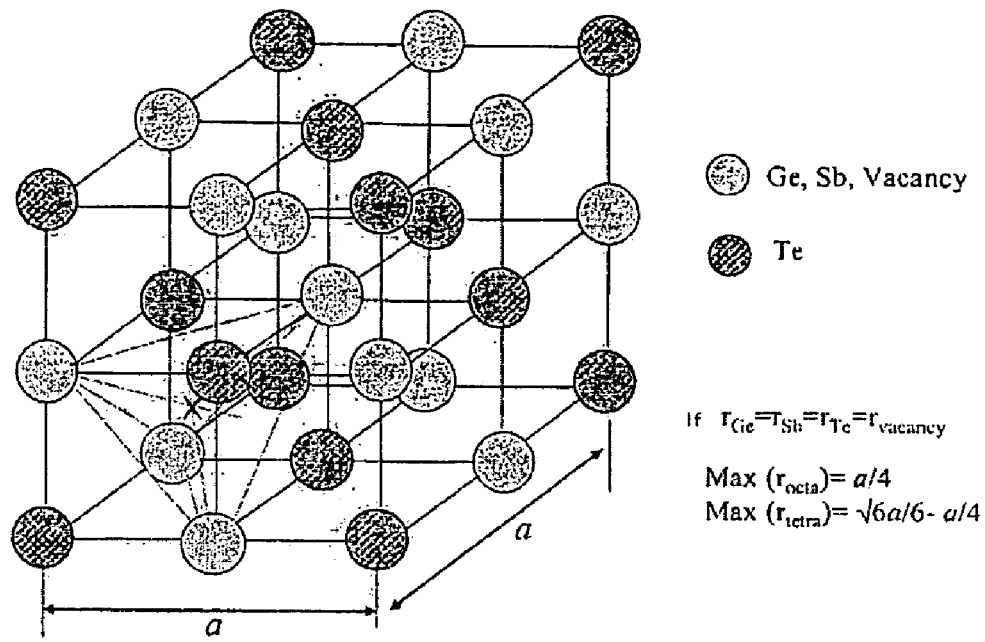
FIGS. 4a and 4b depict the conventional unit cell of a metastable crystalline (face centered cubic) $Ge_2Sb_2Te_5$ material and the atomic configuration in the (001) plane according to a recent structural model, respectively.

The metastable crystalline $Ge_2Sb_2Te_5$ material shown in FIG. 4a has two fcc sublattices. One fcc sublattice is occupied by Te atoms while the other is occupied by Ge, Sb and vacancies. The presence of vacancies in the Ge/Sb sublattice is essential since every Ge/Sb atom (belonging to groups IV and V of the periodic table) is not able to be supplied with additional bonding electrons by Te atoms so as to have the complete nearest neighbor coordination (6) of the ideal rocksalt structure. As shown in FIG. 4a, all the constituents, i.e., Ge, Sb, Te and vacancy, are placed in the octahedral sites. The tetrahedral sites, as discussed below, are indicated by "X" in FIG. 4a.

Figure 4B:
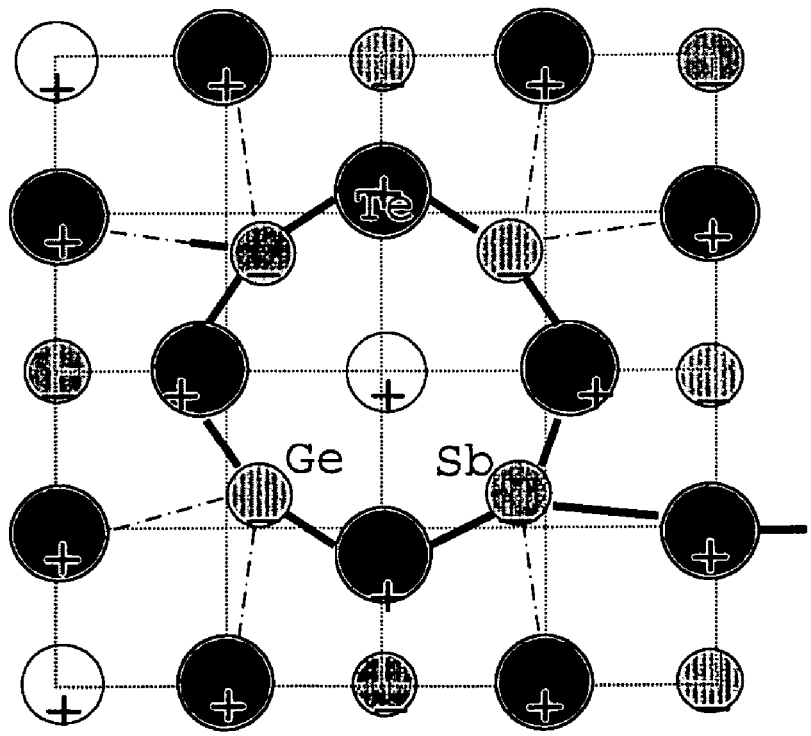

The (001) plane of the above crystalline structure is shown in FIG. 4b in accordance with the structural model suggested by A. V. Kolobov et al. (A. V. Kolobov et al., Nature Materials, 3, 703, 2004). The lengths of the Ge—Te and Sb—Te bonds are not exactly what are expected from the ideal configuration; they are in reality somewhat longer or shorter than the ideal values. The structural unit, connected by bold lines in FIG. 4b, represents a building block of $Ge_2Sb_2Te_5$ that tends to maintain its structure integrity throughout reversible phase changes. When heated for melting, bonds between blocks consisting of the Ge—Te and Sb—Te longer bonds are broken. It was reported that the Ge atoms shift from the octahedral sites to the tetrahedral sites through umbrella flip during amorphization and shift vice versa during crystallization.

This structural model provides us with a clue on the question of what would happen if non-metallic light elements such as B, C, N or O are added to $Ge_2Sb_2Te_5$ material.

Let us first estimate the maximum sizes of the octahedral and tetrahedral sites of the ideal rocksalt structure into which non-metallic light elements may be accommodated. When it is assumed that all the atoms constituting the sublattices have the same sizes and that atoms are close-packed along the <100> directions, the maximum allowable radius of the octahedral site is 0.25 a ($R_{octa}$) and that of the tetrahedral site being 0.1582 a ($R_{tetra}$), where the parameter "a" represents the lattice constant shown in FIG. 4a.

Accordingly, when it comes to $Ge_2Sb_2Te_5$ with a rocksalt structure where a is 6.02 Å, the maximum radii at the octahedral and tetrahedral sites are 1.505 Å and 0.9524 Å, respectively. These values are bigger than the atomic radii of B, C, N and O (0.85 Å, 0.7 Å, 0.65 Å and 0.6 Å, respectively). Therefore, these non-metallic light elements can enter the metastable crystalline structure of $Ge_2Sb_2Te_5$ without causing homogeneous lattice distortion and tend to fill in the octahedral sites preferentially as they are bigger than the tetrahedral sites.

However, it must be noted that the tetrahedral sites of $Ge_2Sb_2Te_5$ are accessible to non-metallic light elements, while the octahedral sites are so only when they are not occupied by Ge, Sb or Te i.e., when there are vacancies. Accordingly, the amount of the non-metallic light elements occupiable in the octahedral sites would depend on the vacancy concentration. Further, it must be recognized that B and C are not reactive with Ge, Sb and Te, while oxygen (O) reacts with either Ge, Sb or Te, and nitrogen (N), with Ge, possibly leading to varying tendencies in the occupation of different types of sites among non-metallic light elements.

Non-metallic light elements in octahedral and/or tetrahedral sites are not likely to affect the melting temperature of the memory material since the presence of such elements in such sites may not interrupt the rupture of longer bonds of Ge—Te and Sb—Te that is supposed to be required for melting.

However, the Ge or Sb atom occupying the tetrahedral site of the aforementioned structural unit (in FIG. 4b) would shift to the octahedral site under conditions for crystallization. When specific non-metallic elements are added thereto, said shift would be hampered and the thermal energy needed for the crystallization would be raised, thereby increasing the crystallization temperature.

A chalcogenide memory material such as $Ge_2Sb_2Te_5$ is a p-type semiconductor where carriers are in the form of holes produced by the excitation of the valence electrons to the trap level of acceptors provided by atomic vacancies. Non-metallic light elements, B, C, N and O, have different numbers of valence electrons and different tendencies in the formation of covalent bonds with Ge, Sb and Te. Nevertheless, they will all eventually occupy vacancies resulting in a heightened trap level or a reduction in the number of trap levels for housing electrons. Consequently, the reduced concentration of holes and reduced mobility by scattering would lead to lowering of the electrical conductivity (i.e., raising electrical resistivity).

As for the thermal conductivity, it may decrease due to increased phonon scattering in the ubiquitous presence of impurities as well as due to decreased hole concentration. At elevated temperatures, in particular, where the influence of phonons on the thermal conductivity becomes more substantial, a significant decrease in thermal conductivity can be expected of a memory material having non-metallic light elements.

Non-metallic light elements can enter the crystalline material not only intra-granularly into atomic vacancies in the octahedral or tetrahedral sites but also inter-granularly into grain boundaries while giving rise to grain refinement. Especially, N and O may segregate at the grain boundaries and form oxides or nitrides therein. No significant changes in the melting temperature and crystallization temperature of the intra-granular material are generally expected in such cases. However, if grains are made so small that the surface to volume ratio becomes very large, decrease in melting temperature and/or increase in crystallization temperature may take place due to size effects. With grain refinement, the electrical and thermal conductivities of the entire material would be reduced. Additional decrease may also come about, as individual grain becomes isolated from each other by N- or O-rich material having relatively low electrical and thermal conductivities. Further, flow of the molten material may be reduced by the presence of oxides or nitrides along the grain boundaries providing they have higher melting temperatures than the grain material. Accordingly, rewritability of the memory material can be enhanced.

Recent studies on some base materials comprising the inventive memory materials such as AgInSbTe and SbTe of specific Sb/Te ratios revealed that laser crystallization (characterized by an annealing time of the order of hundred ns to μs) of these materials produces a rocksalt-like structure or a hexagonal structure that can be envisioned as being derived from a rocksalt-like structure by extension along one of the <111> axes. Considering that crystallization using electrical pulses would yield the same results, it follows that the proposed model for accommodation of non-metallic light elements in the rocksalt-like structure of the conventional $Ge_2Sb_2Te_5$ may be also applicable, to a large extent, to the inventive memory materials composed of base materials having the rocksalt-like or its derivative structures in the metastable crystalline states.

In summary, when a non-metallic light element such as B, C, N or O is added to the base material in accordance with the present invention, in particular the Te-based material, the following effects can be expected:

First, non-metallic light elements will occupy the tetrahedral sites and vacancies in the octahedral sites. The melting temperature is not substantially affected by such occupation but the crystallization temperature would be elevated, while the electrical and thermal conductivities would decrease.

Second, if non-metallic light elements enter the grain boundaries, they would lower the electrical and thermal conductivities without affecting the crystallization temperature or the melting temperature. The resulting beneficial effects are, therefore, significant reductions of both the power consumption for reset operation and thermal interference between memory cells, leading to enhanced data retention.

Finally, even though the structure and mechanism of the present invention have been explained based on the metastable rocksalt-like crystalline structure, it must be noted that this concept can also be applied to a stable crystalline state, as is obvious considering the close structural relationship between the metastable and stable state shown for the case of pseudo-binary materials of $(GeTe)_x(Sb_2Te_3)_{1-x}$.

Specific aspects of the present invention are further illustrated through the following Example, without limiting the scope thereof.

EXAMPLE

Ge—Sb—Te—N films were fabricated by a reactive RF magnetron sputter method employing $Ge_5Sb_{75}Te_{20}$ (Mitsubishi Materials Co.) as a sputter target. A mixture of Ar and nitrogen was employed as the sputter gas at 2 mTorr and at a fixed power of 25 W. For thermal analysis, a stainless steel foil was employed as a substrate. A 2 μm-thick film was formed on the stainless steel foil, which was then crumpled to collect film debris. For the purpose of measuring the electrical resistivity, 100 nm-thick films were also fabricated on glass substrates.

Figure 5A:
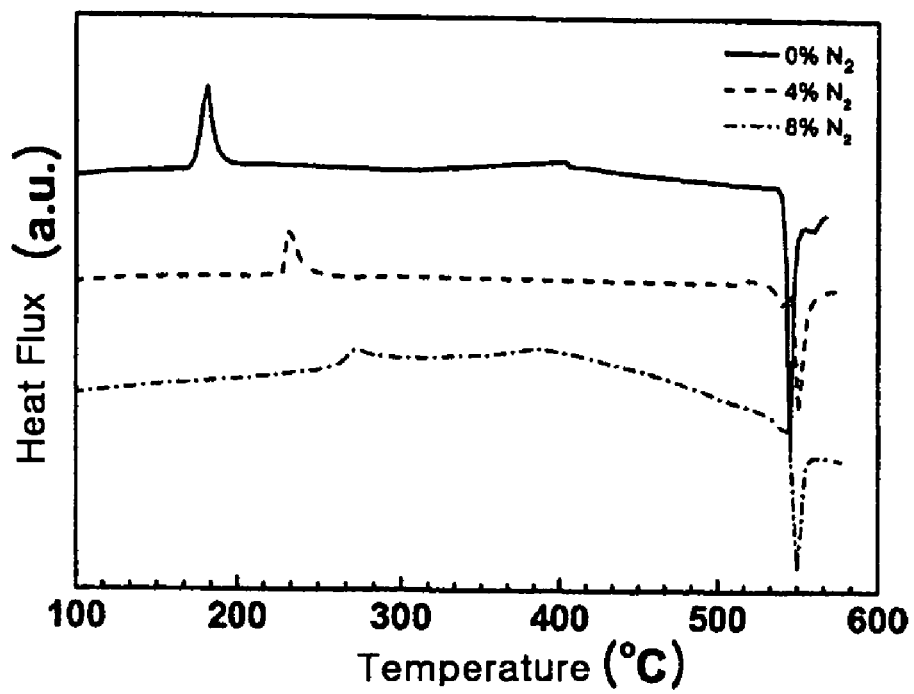
FIGS. 5a and 5b are graphs showing differential scanning calorimetry (DSC) data and the temperatures of phase changes, i.e., crystallization and melting, for three samples fabricated with different $N_2$ contents in the sputter gas.
Figure 5B:
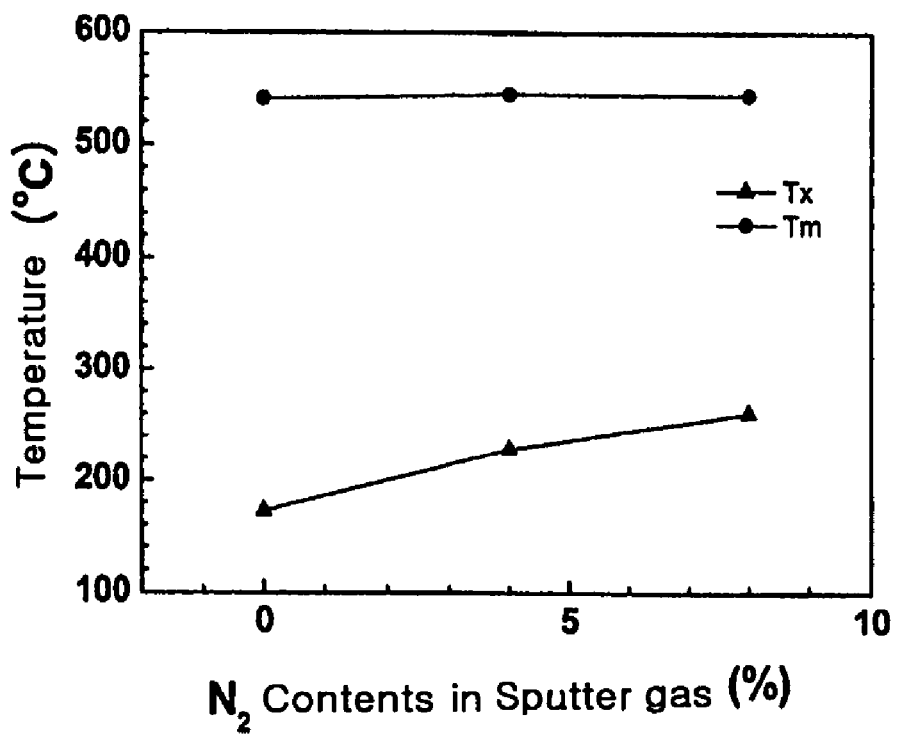

FIG. 5a is a graph showing differential scanning calorimetry (DSC) data for three samples obtained using sputter gases of varying $N_2$ content (expressed in terms of percentile ratio of $N_2$ gas flow rate with respect to the total gas flow rate), and FIG. 5b, the influence of the $N_2$ content in the sputter gas on the crystallization temperature and the melting temperature. The scanning rates were 5° C./min (FIG. 5a) and 10° C./min (FIG. 5b), respectively.

In contrast to the melting temperature of 630° C. for $Ge_2Sb_2Te_5$, a widely employed phase change material, the melting temperature of a film sputtered from $Ge_5Sb_{75}Te_{20}$ was found to be 540° C. as shown in FIGS. 5a and 5b, the change in the $N_2$ content of the sputter gas having exerted negligible effects on the melting temperature of the base material. Meanwhile, the crystallization temperature of the base material increased from 172° C. to 260° C. when the $N_2$ content of the sputter gas was raised from 0 to 8%.

Figure 6A:
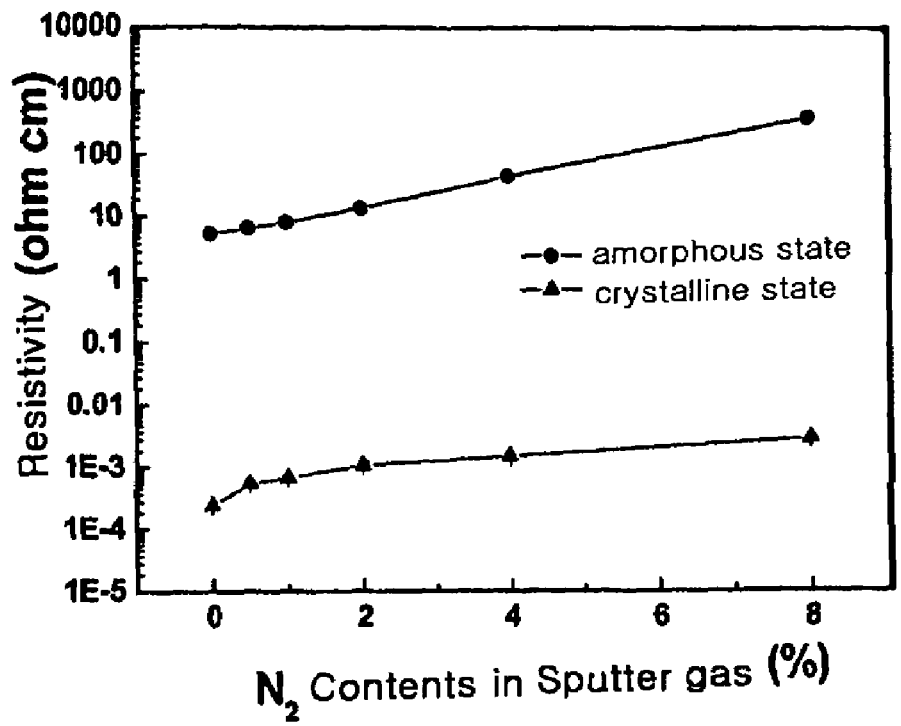
FIGS. 6a and 6b are graphs showing the influences of the $N_2$ content of the sputter gas on the resistivity, and carrier density/mobility for amorphous and annealed film samples, respectively, the annealed sample being heat-treated at 250° C. for 5 minutes.
Figure 6B:
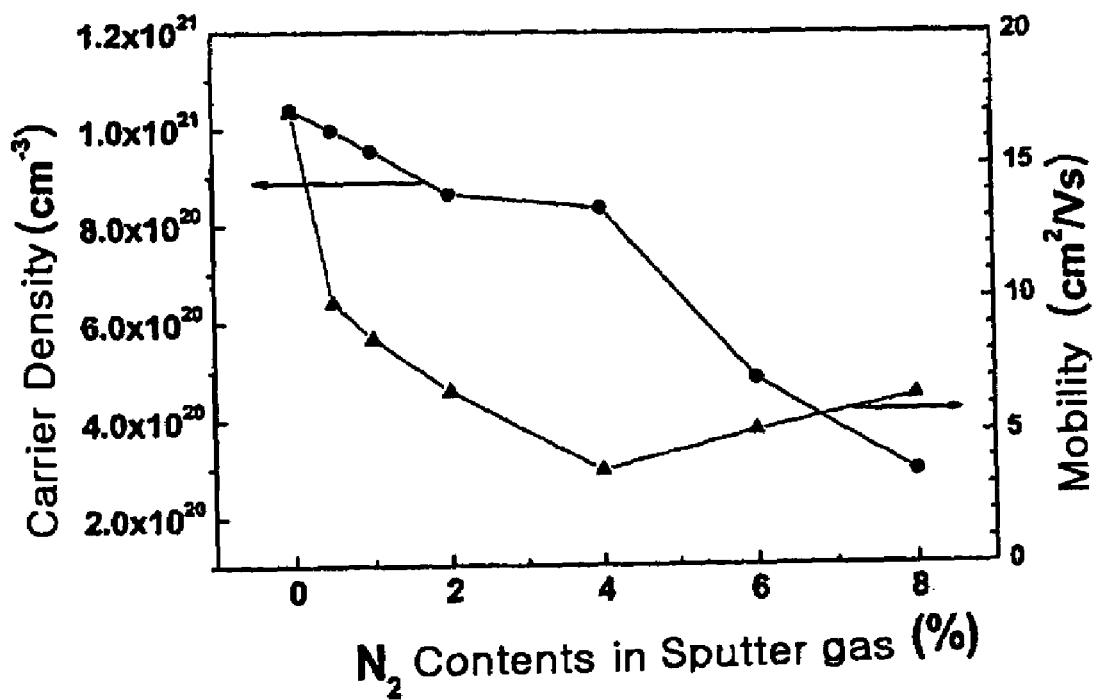

FIGS. 6a and 6b illustrate the influences of the $N_2$ content of the sputter gas on the resistivity, hole concentration and mobility of amorphous and annealed film samples, respectively, the annealed sample being made by RTA (Rapid Thermal Anneal) heating at 250° C. for 5 minutes. The resistivity of the annealed film was low at about $2.7 \times 10^{-4}$ Ω·cm to $\sim 3 \times 10^{-3}$ Ω·cm as the $N_2$ content of the sputter gas was raised from 0% to 8%. This suggests that the incorporated N atoms reduce the mobility and concentration of hole carriers.

While the invention has been shown and described with respect to the preferred embodiment, it will be understood by those skilled in the art that various changes and modification may be made without departing from the spirit and scope of the invention as defined in the following claims.

What is claimed is:

1. A non-volatile phase change memory cell comprising a phase change memory material comprising a base material and at least one non-metallic light element added to the base material, wherein the base material has a composition which, when expressed in terms of atomic fractions of constituent atoms, corresponds to either that of congruent melting with a minimum melting point or that of eutectic melting within the range of ±0.15 atomic fraction for each constituent element and wherein the memory material is expressed by the following composition consisting of:

$A_xM_y(Sb_aTe_{1-a})_z$ wherein, A is at least one non-metallic element selected from the group consisting of boron, carbon, nitrogen and oxygen; M is Ge; and x, y, z and a are mole fractions satisfying x+y+z=1, 0<x<0.2, 0<y<0.15, and 0.6≦a≦0.85, respectively.

* * * * *